United States Patent
Huang et al.

(10) Patent No.: US 7,550,356 B2
(45) Date of Patent: Jun. 23, 2009

(54) METHOD OF FABRICATING STRAINED-SILICON TRANSISTORS

(75) Inventors: Cheng-Tung Huang, Kao-Hsiung (TW); Chia-Wen Liang, Hsin-Chu (TW); Tzyy-Ming Cheng, Hsin-Chu (TW); Tzer-Min Shen, Hsin-Chu (TW); Yi-Chung Sheng, Tai-Chung (TW)

(73) Assignee: United Microelectronics Corp., Hsin-Chu (TW)

( * ) Notice: Subject to any disclaimer, the term of this patent is extended or adjusted under 35 U.S.C. 154(b) by 47 days.

(21) Appl. No.: 11/164,177

(22) Filed: Nov. 14, 2005

(65) Prior Publication Data

US 2007/0111416 A1    May 17, 2007

(51) Int. Cl.
 *H01L 21/336* (2006.01)
(52) U.S. Cl. .................. 438/301; 438/299; 438/378; 438/655; 438/778; 438/787; 438/791; 438/938
(58) Field of Classification Search .................. 438/142, 438/299, 301, 378, 586, 655, 778, 787, 791, 438/938
See application file for complete search history.

(56) References Cited

U.S. PATENT DOCUMENTS

| | | | |
|---|---|---|---|
| 6,180,464 B1 * | 1/2001 | Krivokapic et al. | 438/289 |
| 6,991,998 B2 * | 1/2006 | Bedell et al. | 438/479 |
| 7,002,209 B2 * | 2/2006 | Chen et al. | 257/336 |
| 7,060,579 B2 * | 6/2006 | Chidambaram et al. | 438/303 |
| 7,115,954 B2 * | 10/2006 | Shimizu et al. | 257/369 |
| 7,129,548 B2 * | 10/2006 | Chan et al. | 257/382 |
| 7,358,128 B2 * | 4/2008 | Kim | 438/199 |
| 2004/0142545 A1 | 7/2004 | Ngo | |
| 2004/0253791 A1 | 12/2004 | Sun | |
| 2005/0247926 A1 | 11/2005 | Sun | |
| 2005/0260808 A1 | 11/2005 | Chen | |
| 2006/0017138 A1 * | 1/2006 | Ting | 257/632 |
| 2006/0094194 A1 * | 5/2006 | Chen et al. | 438/301 |
| 2006/0118892 A1 * | 6/2006 | Wu et al. | 257/412 |
| 2007/0066022 A1 * | 3/2007 | Chen et al. | 438/287 |
| 2007/0105368 A1 * | 5/2007 | Tsui et al. | 438/624 |
| 2007/0108525 A1 * | 5/2007 | Yang et al. | 257/351 |

FOREIGN PATENT DOCUMENTS

JP    6-45355    2/1994

* cited by examiner

*Primary Examiner*—Kevin M Picardat
*Assistant Examiner*—Bac H Au
(74) *Attorney, Agent, or Firm*—Winston Hsu

(57) ABSTRACT

A method of fabricating strained-silicon transistors includes providing a semiconductor substrate, in which the semiconductor substrate includes a gate, at least a spacer, and a source/drain region; performing a first rapid thermal annealing (RTA) process; removing the spacer and forming a high tensile stress film over the surface of the gate and the source/drain region; and performing a second rapid thermal annealing process.

7 Claims, 7 Drawing Sheets

METHOD OF FABRICATING STRAINED-SILICON TRANSISTORS

BACKGROUND OF THE INVENTION

1. Field of the Invention

The present invention relates to a method of fabricating semiconductor devices, and more particularly, to a method of fabricating strained-silicon transistors.

2. Description of the Prior Art

The performance of MOS transistors has increased year after year with the diminution of critical dimensions and the advance of large-scale integrated circuits (LSI). However, it has been recently pointed out that the miniaturization attained by a lithographic technology has reached its limit. Therefore, how to improve the carrier mobility so as to increase the speed performance of MOS transistors has become a major topic for study in the semiconductor field. For the known arts, attempts have been made to use a strained silicon layer, which has been grown epitaxially on a silicon substrate with a silicon germanium (SiGe) layer disposed therebetween. In this type of MOS transistor, a biaxial tensile strain occurs in the epitaxy silicon layer due to the silicon germanium which has a larger lattice constant than silicon, and, as a result, the band structure alters, and the carrier mobility increases. This enhances the speed performance of the MOS transistors.

However, the above technique still suffers the following disadvantages. First, the silicon germanium is deposited across the substrate, making it harder to optimize NMOS and PMOS transistors separately. Second, the silicon germanium layer has poor thermal conductivity. Another concern is that some dopants diffuse more rapidly through the SiGe layer, resulting in a sub-optimum diffusion profile in the source/drain region. Moreover, despite the fact that the SiGe deposited into the predetermined source/drain region via a selective epitaxial growth (SEG) will increase the electron hole mobility of strained-silicon PMOS transistors, the process however will simultaneously decrease the electron mobility of NMOS transistors and influence the overall effectiveness of the transistor.

Preferably, a method commonly used by the industry to increase the electron mobility of NMOS transistors involves depositing a high tensile stress film composed of silicon nitride or silicon oxide over the surface of the NMOS transistors. Consequently, the stress of the high tensile stress film can be utilized to expand the lattice arrangement of the semiconductor substrate underneath the NMOS transistor and at the same time, increase the electron mobility of NMOS transistors.

Please refer to FIG. 1 through FIG. 3. FIG. 1 through FIG. 3 are perspective diagrams showing the means of fabricating a strained-silicon NMOS transistor according to the prior art. As shown in FIG. 1, a semiconductor substrate 10 is provided and a gate structure 12 is formed on the semiconductor substrate 10, in which the gate structure 12 includes a gate oxide layer 14, a gate 16 disposed on the gate oxide layer 14, a cap layer 18 disposed on the gate 16, and an oxide-nitride-oxide (ONO) offset spacer 20. Preferably, the gate oxide layer 14 is composed of silicon dioxide, the gate 16 is composed of doped polysilicon, and the cap layer 18 is composed of silicon nitride to protect the gate 16. Additionally, a shallow trench isolation (STI) 22 is formed around the active area of the gate structure 21 within the semiconductor substrate 10.

As shown in FIG. 2, an ion implantation process is performed to form a source/drain region 26 in the semiconductor substrate 10 around the spacer 20. Next, a rapid thermal annealing (RTA) process is performed to activate the dopants within the source/drain region 26 and repair the damage of the lattice structure of the semiconductor substrate 10 resulting from the ion implantation process.

As shown in FIG. 3, a high tensile stress film 28 composed of silicon nitride or silicon oxide is disposed over the surface of the gate structure 12 and the source/drain region 26. Subsequently, another rapid thermal annealing process is performed to expand the semiconductor substrate 10 underneath the gate 16, such as the lattice arrangement in the channel region, to increase the electron mobility of the strained silicon NMOS transistor.

Since the conventional method of forming high tensile stress film 28 involves disposing a high tensile stress film 28 over the surface of the gate structure 12 and the source/drain region 26 of the NMOS transistor, the stress of the high tensile stress film 28 utilized for increasing the electron mobility of NMOS transistor however will be strongly limited by the block of the spacer 20. Consequently, the effect will become much more obvious in the semiconductor fabrication under 62 nm or below.

SUMMARY OF THE INVENTION

It is therefore an objective of the present invention to provide a method of fabricating strained-silicon transistors for improving the conventional problem of being unable to effectively increase the electron mobility of NMOS transistors.

According to the present invention, a method of fabricating strained-silicon transistors comprises: providing a semiconductor substrate, in which the semiconductor substrate comprises a gate, at least a spacer, and a source/drain region; performing a first rapid thermal annealing (RTA) process; removing the spacer and forming a high tensile stress film over the surface of the gate and the source/drain region; and performing a second rapid thermal annealing process.

According to another aspect of the present invention, a method of fabricating strained-silicon transistors comprises: providing a semiconductor substrate, in which the semiconductor substrate comprises a gate, at least a spacer, and a source/drain region; removing the spacer and forming a high tensile stress film over the surface of the gate and the source/drain region; and performing a rapid thermal annealing process to simultaneously activate the dopants within the source/drain region and expand the lattice arrangement of the semiconductor substrate beneath the gate.

By utilizing the gate and spacer as a mask to implant the source/drain region, removing the spacer surrounding the gate, depositing a high tensile stress film over the surface of the gate and the source/drain region, and performing a rapid thermal annealing process, the present invention is able to increase the stress and movement of electrons of the strained-silicon transistor by expanding the lattice arrangement of the channel region within the semiconductor substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
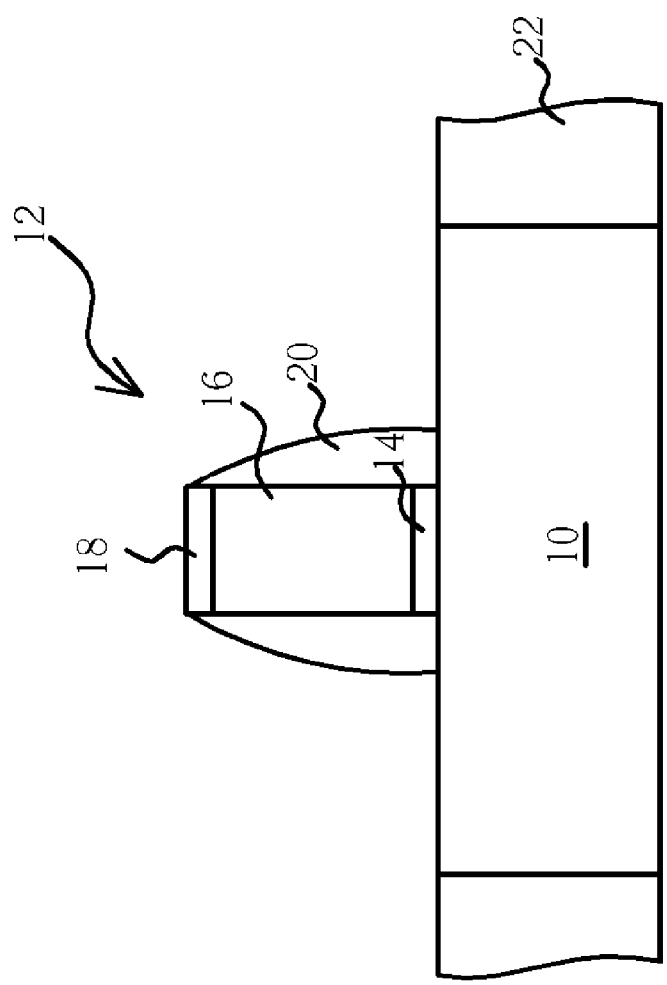
FIG. 1 through FIG. 3 are perspective diagrams showing the means of fabricating a strained-silicon NMOS transistor according to the prior art.
Figure 2:
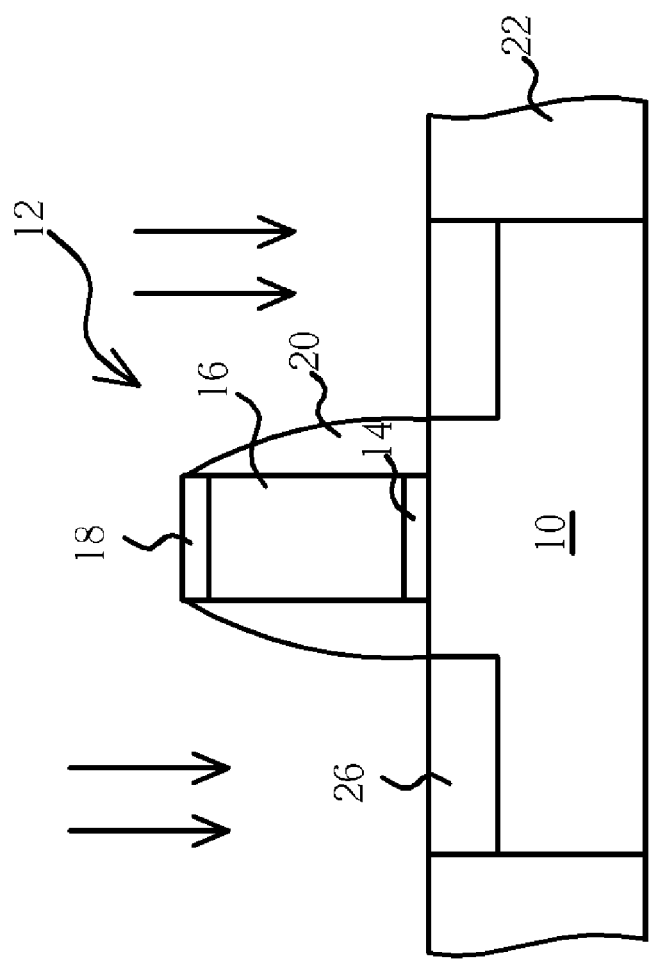
Figure 3:
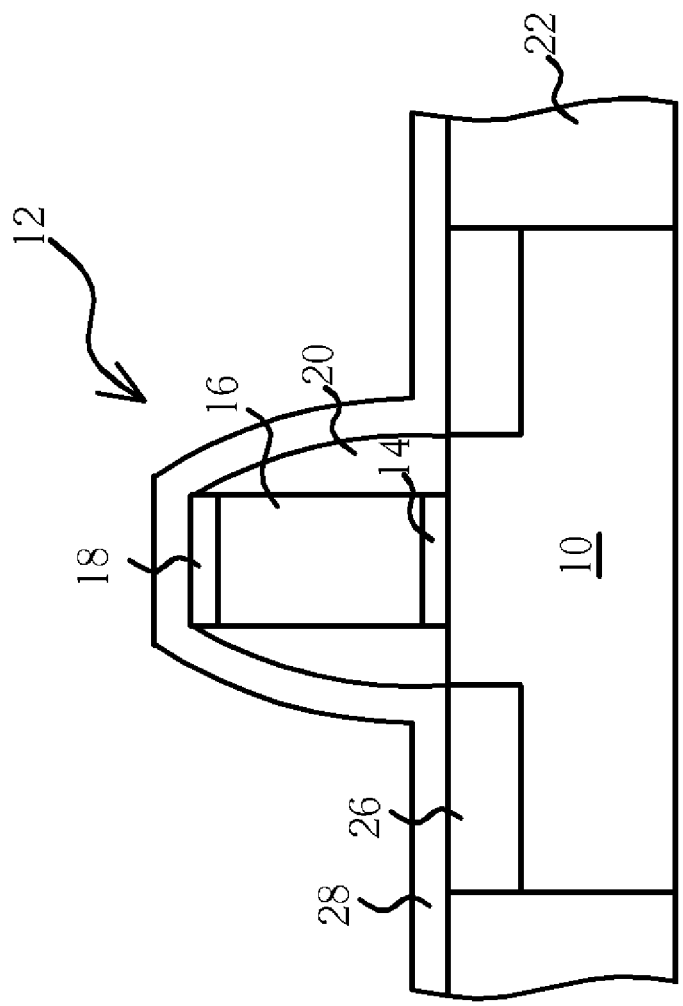
Figure 4:
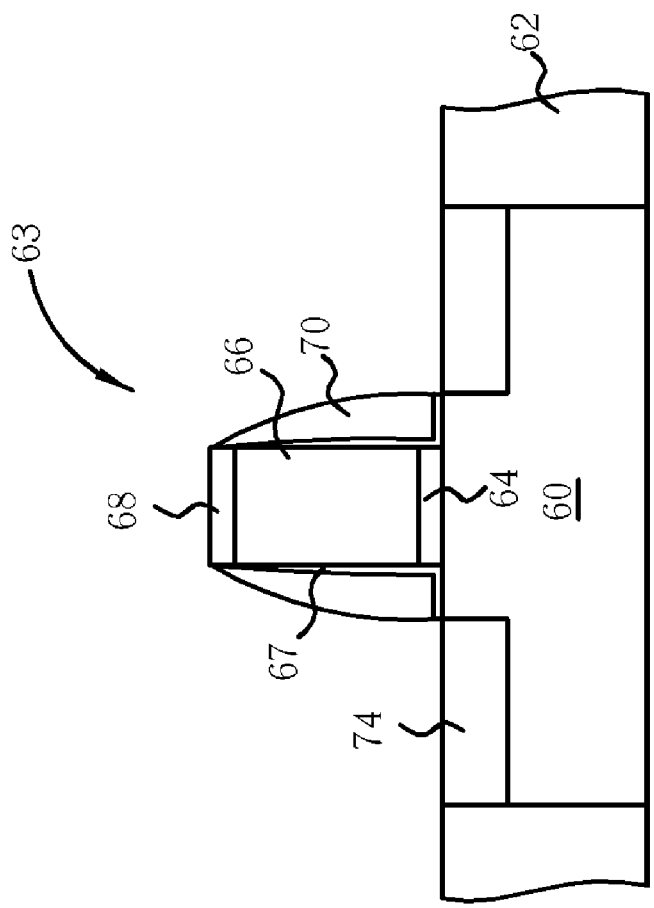
FIG. 4 through FIG. 6 are perspective diagrams showing the means of fabricating a strained-silicon NMOS transistor according to the present invention.
Figure 5:
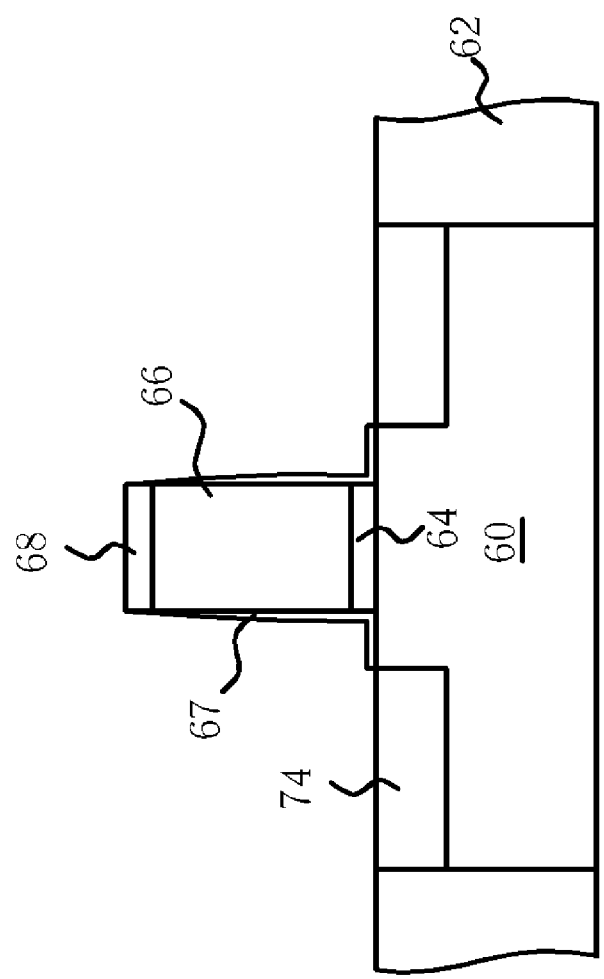
Figure 6:
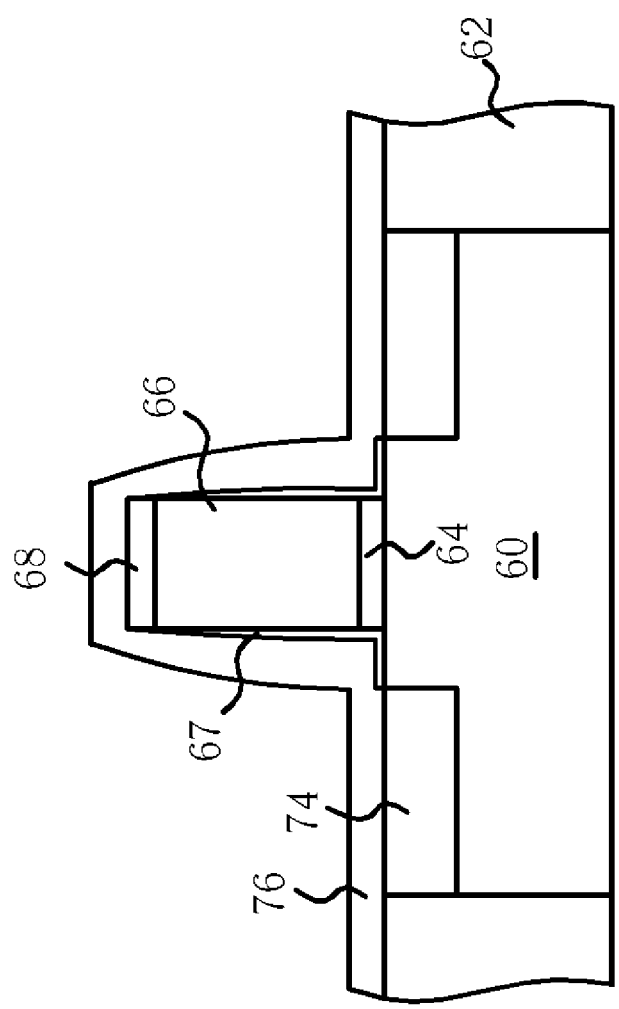

Please refer to FIG. 4 through FIG. 6. FIG. 4 through FIG. 6 are perspective diagrams showing the means of fabricating a strained-silicon PMOS transistor according to the present invention. As shown in FIG. 4, a semiconductor substrate 60, such as a silicon wafer or a silicon-on-insulator (SOI) substrate, is provided and a gate structure 63 is formed on the semiconductor substrate 60, in which the gate structure 63 includes a gate dielectric 64, a gate 66 disposed on the gate dielectric 64, a cap layer 68 formed on the gate 66, an oxide liner 67 disposed around the gate 66, and a spacer 70 formed on the oxide liner 67. Preferably, the gate dielectric 64 is composed of silicon dioxide via oxidation or deposition processes, the gate 66 is composed of doped polysilicon, and the cap layer 68 is composed of silicon nitride for protecting the gate 66 or polycide. Additionally, a shallow trench isolation (STI) 62 is formed around the active area of the gate structure 63 within the semiconductor substrate 60. Next, an ion implantation process is performed to form a source/drain region 74 in the semiconductor substrate 60 around the gate 66.

As shown in FIG. 5, after removing the spacer 70 surrounding the gate 66 (as shown in the figure) or removing the spacer 70 and the oxide liner 67 simultaneously, a rapid thermal annealing process is performed to use a temperature between 900° C. to 1050° C. to activate the dopants within the source/drain region 74, and at the same time repair the damage of the lattice structure of the semiconductor substrate 60 surface resulting from the ion implantation process.

As shown in FIG. 6, a high tensile stress film 76 composed of silicon nitride or silicon oxide is formed over the top of the gate 66, the side of the gate 66, and the surface of the source/drain region 74. Next, by utilizing the stress of the high tensile stress film 76, another rapid thermal annealing process with lower temperature is performed to expand the semiconductor substrate 60 beneath the gate 66, such as the lattice arrangement in the channel region, to increase the electron mobility of the NMOS transistor. Preferably, the rapid thermal annealing process with lower temperature is between 100° C. and 900° C. and according to the preferred embodiment of the present invention, the preferred temperature of the lower temperature thermal annealing process is 500° C.

Alternatively, the high tensile stress film 76 composed of silicon nitride or silicon oxide can be first deposited directly over the top and side of the gate 66 and the surface of the source/drain region 74 after implanting the source/drain region 74 and removing the spacer 70. Next, another rapid thermal annealing process is performed, and by utilizing this single rapid thermal annealing process, the present invention is able to simultaneously activate the dopants within the source/drain region 74 and expand the lattice arrangement of the semiconductor substrate 60 beneath the gate 66, thereby simplifying the fabrication process, reducing the thermal budget, and increasing the stress and electron mobility of the NMOS transistor.

Figure 7:
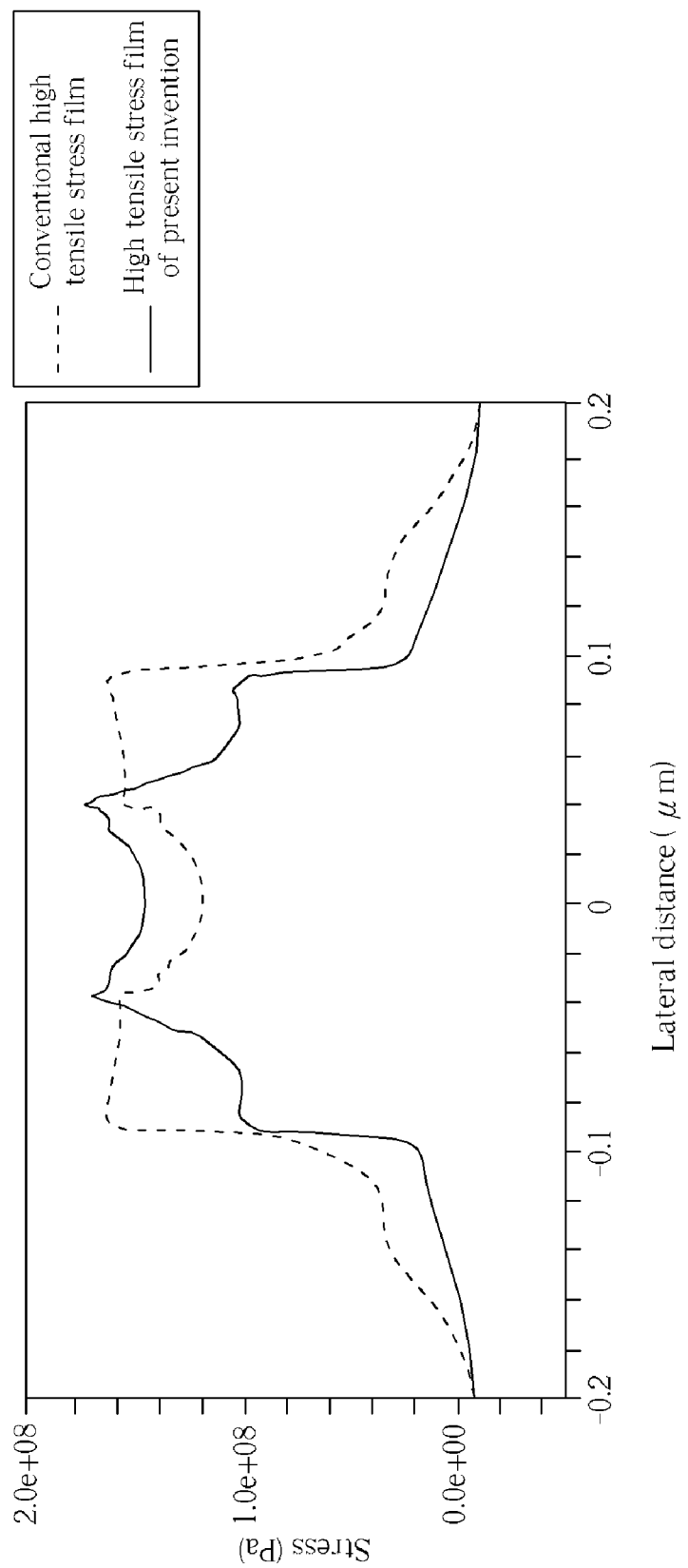
FIG. 7 is a perspective diagram showing the comparison of the conventional high tensile stress film and the high tensile stress film of the present invention.

Please refer to FIG. 7. FIG. 7 is a perspective diagram showing the comparison of the conventional high tensile stress film and the high tensile stress film of the present invention. As shown in FIG. 7, the high tensile stress film of the present invention (represented by solid line) demonstrates a much higher stress along the lateral distance of the MOS transistor between −0.04 μm to 0.04 μm than conventional high tensile stress film (represented by dotted line). Evidently, by removing the spacer 70 surrounding the gate 66 before depositing the high tensile stress film 76, the present invention is able to directly contact the top of the gate 66 and the cap layer, the side of the gate 66, and the surface of the source/drain region 74 and increase the area and stress applied to the channel region by the high tensile stress film 76.

According to different fabrication processes and product designs, the present invention is able to incorporate a standard salicide process after the formation of the high tensile stress film 76 by forming a silicide over the surface of the gate 66 and the source/drain region 74. For instance, after removing the high tensile stress film 76 from the surface of the semiconductor substrate 60, gate 66, and the source/drain region 74, a metal layer (not shown) composed of nickel is sputtered over the surface of the gate 66 and the source/drain region 74. Next, a rapid thermal annealing process is performed to react a contact portion of the metal layer and the gate 66 and the source/drain region 74 to form a silicide layer. The unreacted metal layer is removed thereafter.

In contrast to the conventional method of fabricating strained-silicon transistors, the present invention first utilizes the gate and spacer as a mask to implant the source/drain region, remove the spacer surrounding the gate, deposit a high tensile stress film over the surface of the gate and the source/drain region, and perform a rapid thermal annealing process. Consequently, the present invention is able to increase the stress and movement of electrons of the strained-silicon transistor by expanding the lattice arrangement of the channel region within the semiconductor substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating strained-silicon transistors comprising:
    providing a semiconductor substrate, wherein the semiconductor substrate comprises a gate, at least a spacer, and a source/drain region;
    removing the spacer and followed by forming a high tensile stress film over the surface of the gate and the source/drain region;
    performing a first rapid thermal annealing process after removing the spacer and forming the high tensile stress film to simultaneously activate the dopants within the source/drain region and expand the lattice arrangement of the semiconductor substrate beneath the gate;
    removing the high tensile stress film from the surface of the gate and the source/drain region after performing the first rapid thermal annealing process;
    forming a metal layer over the surface of the semiconductor substrate; and
    performing a second rapid thermal annealing process to form a silicide layer.

2. The method of claim 1, wherein the semiconductor substrate comprises wafer or silicon-on-insulator (SOI) substrate.

3. The method of claim 1, wherein the strained-silicon transistor further comprises a gate dielectric disposed between the gate and the semiconductor substrate.

4. The method of claim 1, wherein the top of the gate further comprises a cap layer.

5. The method of claim 1, wherein the source/drain region is formed by utilizing an ion implantation process.

6. The method of claim 1, wherein the high tensile stress film comprises silicon nitride (SiN) or silicon oxide ($SiO_2$).

7. The method of claim 1, wherein the strained-silicon transistor comprises an NMOS transistor.

* * * * *